United States Patent
Camuffo et al.

(10) Patent No.: US 10,129,823 B2
(45) Date of Patent: Nov. 13, 2018

(54) ADAPTIVE ENVELOPE TRACKING THRESHOLD

(71) Applicant: Intel IP Corporation, Santa Clara, CA (US)

(72) Inventors: Andrea Camuffo, Munich (DE); Sandro Pinarello, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 9 days.

(21) Appl. No.: 15/475,996

(22) Filed: Mar. 31, 2017

(65) Prior Publication Data
US 2018/0288697 A1 Oct. 4, 2018

(51) Int. Cl.
| | |
|---|---|
| *H04L 27/08* | (2006.01) |
| *H04W 52/02* | (2009.01) |
| *H04L 12/26* | (2006.01) |
| *H04W 72/04* | (2009.01) |
| *H04J 11/00* | (2006.01) |

(52) U.S. Cl.
CPC ............ *H04W 52/02* (2013.01); *H04L 27/08* (2013.01); *H04L 43/16* (2013.01); *H04J 11/00* (2013.01); *H04W 72/0446* (2013.01); *H04W 72/0473* (2013.01)

(58) Field of Classification Search
CPC ......... H04W 52/02; H04L 27/08; H04L 43/16
See application file for complete search history.

(56) References Cited

U.S. PATENT DOCUMENTS

| | | | | |
|---|---|---|---|---|
| 8,891,681 | B2 | 11/2014 | Boos et al. | |
| 8,909,175 | B1* | 12/2014 | McCallister | H04L 27/368 |
| | | | | 330/127 |
| 9,118,277 | B2* | 8/2015 | Balteanu | H03F 1/0227 |
| 9,385,662 | B2* | 7/2016 | Wimpenny | H03F 1/0227 |
| 9,391,649 | B2 | 7/2016 | Wang | |
| 9,425,744 | B2* | 8/2016 | Yang | H03F 1/0205 |
| 9,627,975 | B2* | 4/2017 | Khlat | H02M 3/1582 |
| 9,973,370 | B1* | 5/2018 | Langer | H04L 27/368 |
| 2009/0190692 | A1 | 7/2009 | Aniruddhan et al. | |
| 2009/0300456 | A1 | 12/2009 | Pelletier et al. | |

(Continued)

OTHER PUBLICATIONS

"U.S. Appl. No. 15/476,014, Non Final Office Action dated Apr. 2, 2018", 16 pgs.

(Continued)

*Primary Examiner* — Rasheed Gidado
(74) *Attorney, Agent, or Firm* — Schwegman Lundberg & Woessner, P.A.

(57) ABSTRACT

An apparatus of a transmitter and method are provided, the apparatus comprising a processor that calculates a supply voltage (SV) value (SVV) to provide as an SV for a power amplifier (PA) of the transmitter for transmissions during a transmission time slot (TS). When the SV < an envelope tracking (ET) threshold (ETT), then the processor configures the PA to transmit a signal in an average power tracking (APT) mode that maintains the SV at the SVV during the TS. When the SV≥ETT, and an APT condition is met, then the processor configures the PA to transmit the signal in the APT mode. When the SV≥ETT, and the APT condition is not met, then the processor transmits by an adjustment to the SVV to track an amplitude modulation envelope during the TS in an ET mode.

20 Claims, 7 Drawing Sheets

(56) References Cited

U.S. PATENT DOCUMENTS

| | | |
|---|---|---|
| 2010/0056068 A1 | 3/2010 | Takinami et al. |
| 2011/0058601 A1 | 3/2011 | Kim et al. |
| 2011/0158156 A1 | 6/2011 | Ma et al. |
| 2011/0188604 A1 | 8/2011 | Wagner |
| 2013/0251068 A1 | 9/2013 | Boos et al. |
| 2014/0055197 A1* | 2/2014 | Khlat ............... H03F 3/45663 330/127 |
| 2014/0111178 A1 | 4/2014 | Khlat et al. |
| 2014/0119476 A1 | 5/2014 | Marsili et al. |
| 2014/0155127 A1* | 6/2014 | Dakshinamurthy ........................ H04W 52/028 455/574 |
| 2014/0293789 A1 | 10/2014 | Machida |
| 2015/0194936 A1 | 7/2015 | Inanoglu et al. |
| 2015/0236652 A1 | 8/2015 | Yang et al. |
| 2017/0257774 A1 | 9/2017 | Ghosh et al. |

OTHER PUBLICATIONS

"International Application Serial No. PCT/US2018/024585, International Search Report dated Jul. 27, 2018", 3 pgs.

"International Application Serial No. PCT/US2018/024585, Written Opinion dated Jul. 27, 2018", 4 pgs.

"International Application Serial No. PCT/US2018/024589, International Search Report dated Jul. 16, 2018", 4 pgs.

"International Application Serial No. PCT/US2018/024589, Written Opinion dated Jul. 16, 2018", 5 pgs.

"U.S. Appl. No. 15/476,014, Notice of Allowance dated Aug. 9, 2018", 6 pgs.

\* cited by examiner

ADAPTIVE ENVELOPE TRACKING THRESHOLD

TECHNICAL FIELD

The present disclosure relates to power conservation in transmitters and transceivers, such as those used in mobile communication devices and base stations.

BACKGROUND

Power conservation is a desirable attribute in a transceiver device, particularly a mobile or portable communication device, such as a cell phone, or a base transceiver station. Such devices may utilize an average power tracking (APT) mechanism or an envelope tracking (ET) mechanism. Cellular transmissions using protocols such as the Long-Term Evolution (LTE)-Advanced protocol (based on a 3GPP Release 10 specification released in March of 2011 and 3GPP Release 13, 2016 Update) may occur in time slots which, according to the LTE protocol, are 0.5 ms.

With the APT mechanism, a biasing voltage supplied to the power amplifier (PA) is selected based on a desired signal quality (linearity and/or efficiency) specified by the communication standard and is fixed during the time slot (but is changeable from slot-to-slot). This PA supply voltage value is set by a DC-DC converter, which takes the DC voltage supplied by a battery of the device and regulates it to a different value that may be used by the PA. The value is calculated based generally on a target output power level for that time slot. For example, if the target value (average power level) for sending the slot is 20 dBm, then a look-up table (LUT) may indicate that the DC-DC voltage should be fixed at 2.7 V for that time slot.

For envelope tracking, a fast DC-DC converter is used so that the supply voltage to the PA is adjusted to track the amplitude modulation signal, which helps reduce the power. However, depending on the characteristics of the output signal, use of ET is not always beneficial.

DETAILED DESCRIPTION

The following is a detailed description of various configurations depicted in the accompanying drawings. However, the amount of detail offered is not intended to limit anticipated variations of the described configurations; to the contrary, the claims and detailed description are to cover all modifications, equivalents, and alternatives falling within the spirit and scope of the present teachings as defined by the claims. The detailed descriptions below are designed to make such configurations understandable to a person having ordinary skill in the art.

Figure 1A:
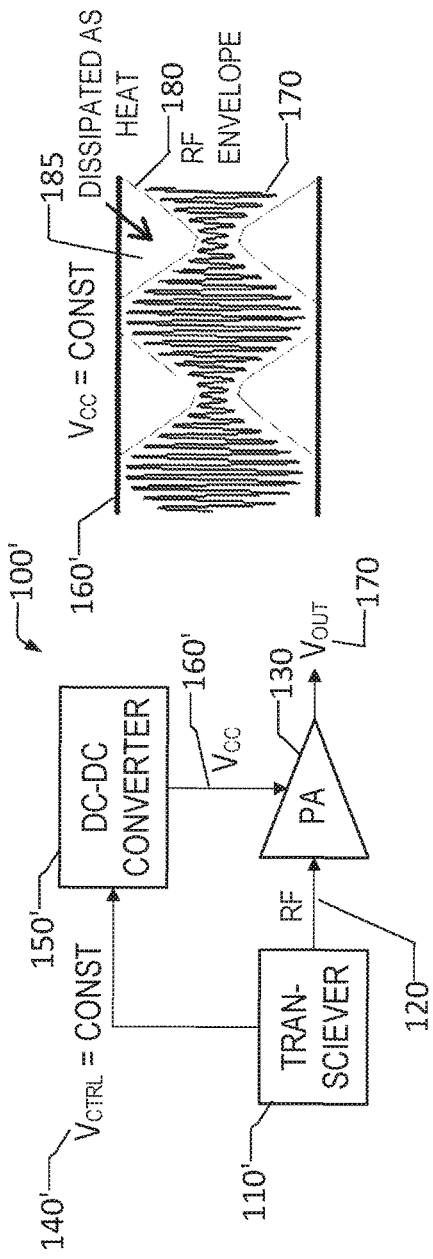
FIG. 1A is a block diagram with output graph that illustrates an APT system or operation in an APT mode.

FIG. 1A is a block diagram with output graph that illustrates an APT system 100' (or operation in an APT mode) in which a transceiver 110' provides a modulated radio frequency (RF) signal 120 to a PA 130. The transceiver 110' also provides a constant control voltage $V_{CTRL}$ 140' to the DC-DC converter 150', which, in turn, provides a constant (for a time slot) supply voltage $V_{CC}$ 160' to the PA 130. The supply voltage $V_{CC}$ 160' mainly depends on a target output level, but may be corrected for frequency, temperature, and modulation type. With $V_{CC}$ 160' constant, it can be seen that the resultant $V_{OUT}$ 170 waveform creates a significant amount of lost energy that is dissipated as heat 185 (inefficiency) when the RF envelope 180 amplitude is less than the supply voltage $V_{CC}$ 160'.

Figure 1B:
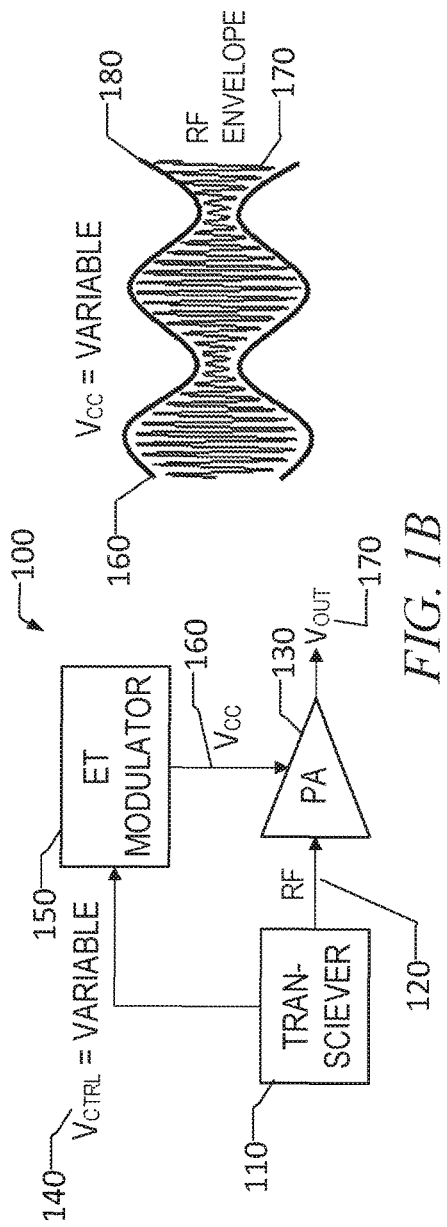
FIG. 1B is a block diagram with output graph that illustrates an ET system 100 (or operation in an ET mode)

FIG. 1B is a block diagram with output graph that illustrates an ET system 100 (or operation in an ET mode). In an ET mode, the control power $V_{CC}$ 160 of the PA 130 follows the modulated amplitude 180 faster than with the DC-DC converter operating in the APT mode, and supplies a high voltage to the PA 130 when the amplitude modulation requires a transmit signal with a high amplitude (beneficial for high power limits). To illustrate, in this system 100, the transceiver 110 provides a modulated RF signal 120 to the PA 130. However, in this configuration, it provides a variable control voltage $V_{CTRL}$ 140 to an envelope tracking (ET) modulator 150, which, in turn, provides a variable/modulated supply voltage $V_{CC}$ 160 to the PA 130. With $V_{CC}$ 160 tracking the RF envelope 180, no power is lost as it was in the design shown in FIG. 1A. The ET modulator 150 may be a fast DC-DC converter whose output voltage varies over time as a function of the amplitude modulation of the transceiver 110. It is most beneficial if the PA 130 can be operated as close as possible to saturation during the modulation peaks and then to lower the voltage when the instantaneous amplitude signal is low, thereby boosting the PA efficiency. By modulating the biasing voltage dynamically depending on the actual value of the signal's envelope, it may be possible to improve the average efficiency.

LTE carrier aggregation (CA) makes it possible to utilize more than one carrier to increase an overall transmission bandwidth. However, when dealing with LTE CA signals, a situation may arise in which the LTE modulation is constituted by disjoined resource blocks (that is, data blocks in discontinuous frequency bands) (in transmit carrier aggregation (TX CA) and multi-cluster transmissions). In such circumstances, the amplitude signal 180, which needs to be tracked by the DC-DC converter (the ET modulator) 150 has a very high frequency content and periodicity at the tracker's 150 output 160, and hence, at the antenna, undesired spurs may arise as a consequence of the DC-DC non-linarites. This is illustrated in the following graphs.

Figure 2A:
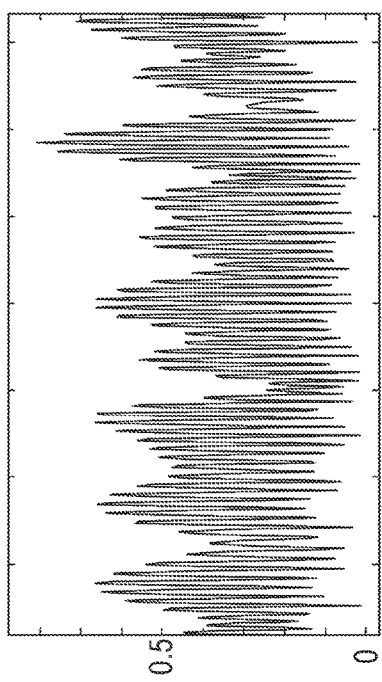
FIG. 2A is a graph showing the spectrum for a case in which there are two clusters of six resource blocks (RBs) each, spaced by 5 MHz.
Figure 2B:
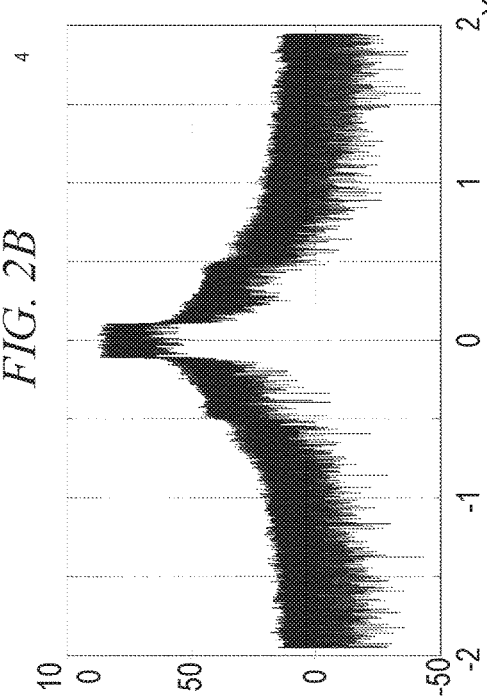
FIG. 2B is a graph showing the power versus time of the combined signal.

FIG. 2A is a graph showing the spectrum for a case in which there are two clusters of six RBs each, spaced by 5 MHz FIG. 2B is a graph showing the power versus time of the combined signal.

Figure 2C:
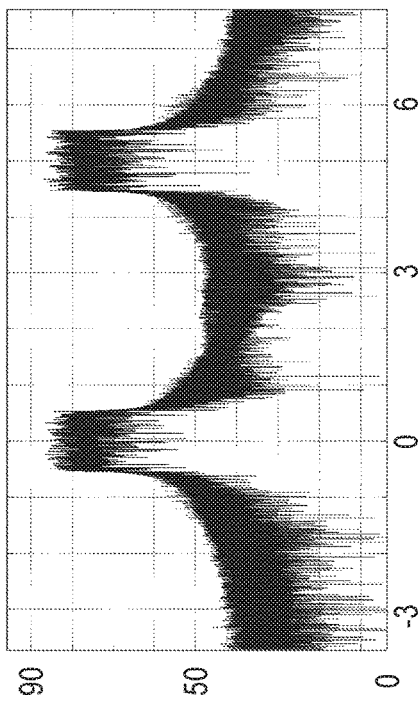
FIG. 2C is a graph similar to the one in FIG. 2A, but showing the spectrum for a case in which there are twelve RBs that are contiguous.
Figure 2D:
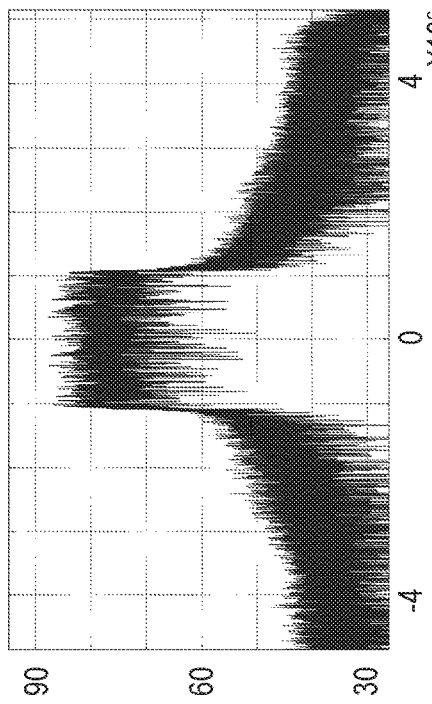
FIG. 2D is the same graph as FIG. 2C, but using a larger scale.
Figure 2E:
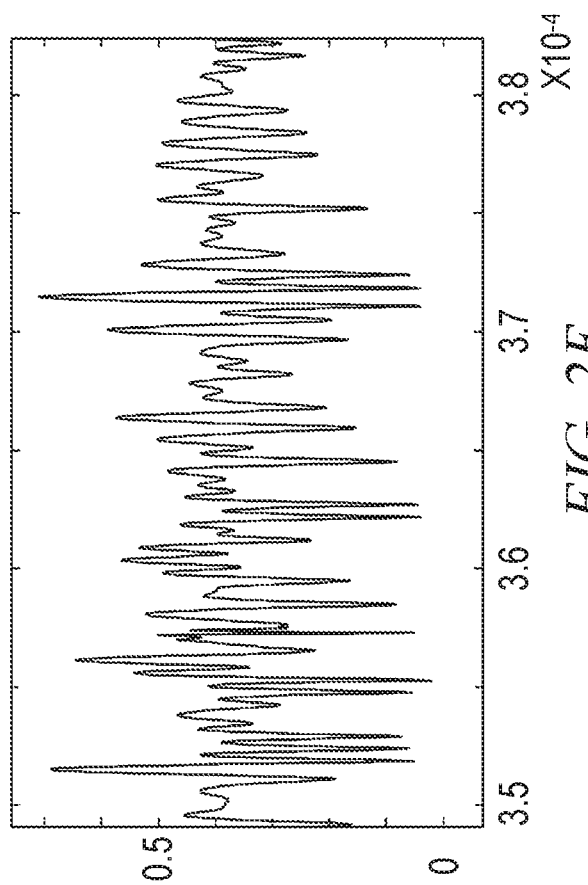
FIG. 2E is a graph similar to the one in FIG. 2B for the case of the twelve contiguous RBs.

FIG. 2C is a graph similar to the one in FIG. 2A, but showing the spectrum for a case in which there are twelve RBs that are contiguous. FIG. 2D is the same graph as FIG. 2C, but using a larger scale. FIG. 2E is a graph similar to the one in FIG. 2B for the case of the twelve contiguous RBs. For the first case in which the clusters of RBs are spaced by 5 MHz, the massive periodicity presents a significant challenge for an envelope tracking system.

Figure 3:
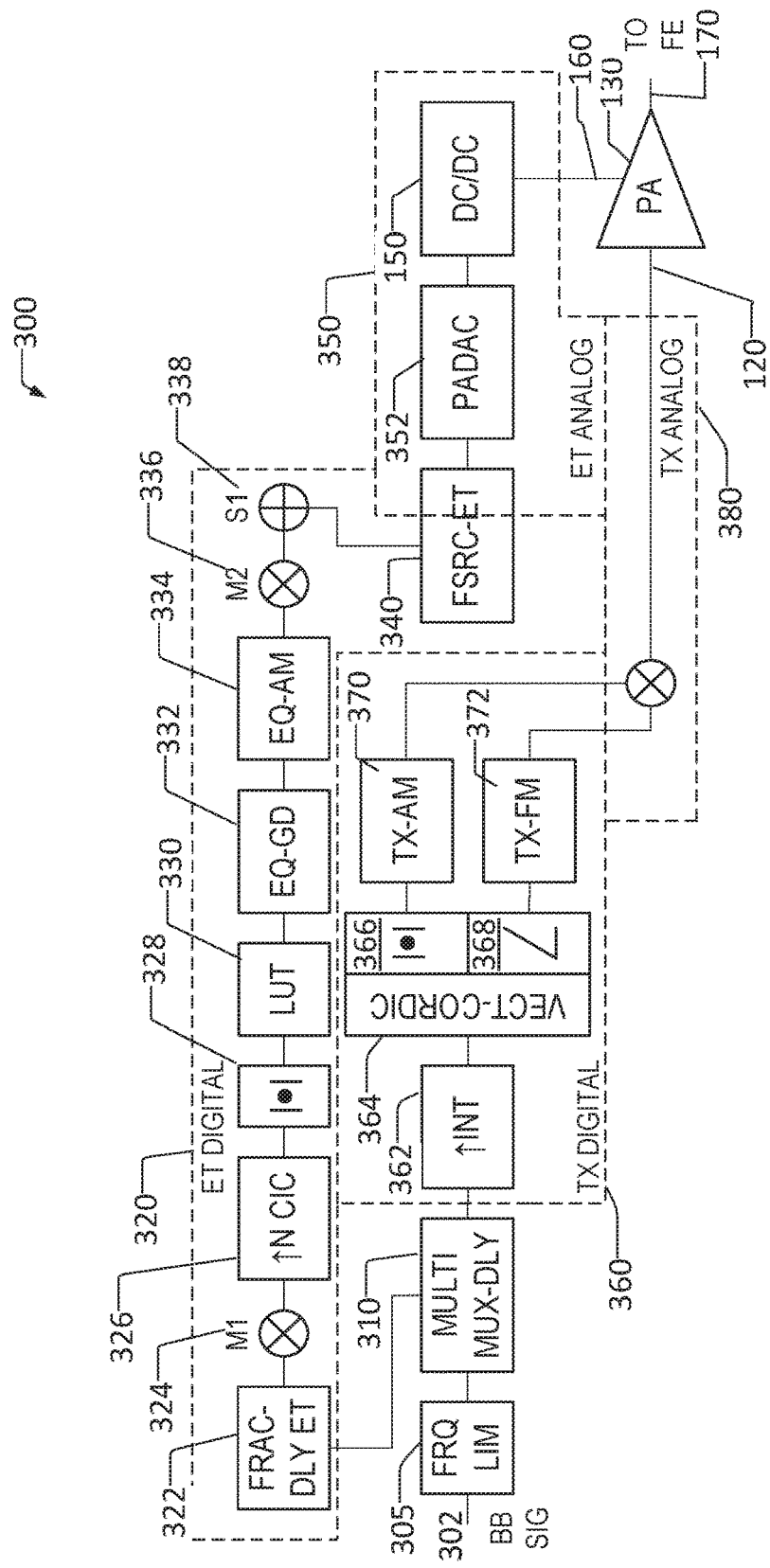
FIG. 3 is a block diagram illustrating an example of a transmitter 300 that may be utilized as described herein.

FIG. 3 is a block diagram illustrating an exemplary example of a transmitter or a transceiver 300 that may be utilized as described herein. The components are generally broken down into an ET path (components in the ET digital 320 and ET analog 350 blocks) and a transmit (TX) path (components in the TX digital 360 and TX analog 380 blocks). The transmitter receives the baseband (BB) signal 302 which is shared between the ET and TX paths. The ET path is used to generate the modulated supply voltage used at the PA 130. The BB signal 302 is branched off after a frequency limiter 305 via a multipurpose multiplexing (MULTI MUX-DLY) circuit 310. This allows an introduction of part of a compensation delay in either the ET or the TX path. A fractional delay block 322 follows for finer time alignment.

ET operation is only practical when the power consumed in the ET path is lower than the power saved in the PA 130 when the ET mode is used. By way of example, it may be determined that with a PA having a maximum power level of 24 dBm, the ET mode is efficient only for power levels at or above 14 dBm (that is, in the upper 10 dB of the power range). When the power level is below this, then it is more efficient to transmit in the APT mode.

When the power is in this high power range, the transmitter or the transceiver 300 may be operated with a closed loop power regulation which affects the amplitude of an AM signal in the TX-AM 370 path. Consequently, in order not to miss an alignment between the signal's envelope at the input of the PA 130 and the supply's envelope, an interface is needed in the ET path which mimics the amplitude scaling induced by the PCL on the TX-AM 370. This is provided by a multiplier M1 324.

In order to target the needed noise limits at the PA output 170 to the antenna port (FE), a clean supply's envelope is needed. This turns out to benefit from a relatively high sampling frequency for the envelope of the BB signal 302. Therefore, an interpolation block ↑N CIC 326 is provided which interpolates the I and Q signals before the calculation of their amplitude. The interpolation 326 takes place just before the coordinate rotation digital computer (CORDIC) |•| 328 calculations (the most convenient place). The interpolation 326 takes place after the delay 322 and the scaling 324 to slow down the sampling rate and save current, and before the CORDIC 328 to simplify the interpolation filtering, due to the bandwidth of the I and Q signals being lower than that of the envelope.

A nonlinear transformation maps corresponding values of the signal envelope to the PA supply 160. This is realized due to the look-up table (LUT) 330 following the CORDIC 328. After the nonlinear transformation is provided by the LUT 330, the linear correction of the amplitude and phase distortions introduced by the following blocks (group delay equalization (EQ-GD) 332 and amplitude equalization (EQ-AM) 334) can be performed. It may be beneficial to keep the EQ-GD 332 and the EQ-AM 334 independent because it increases flexibility, and it allows a dedicated correction of the group delay on its own (constancy of the group delay may be a limiting requirement for ET).

The following analogue parts, such as the power amplifier digital to analog converter (PADAC) 352, may be affected during operation by undesired effects like a drift of the gain with temperature and/or a DC offset. In order to compensate for these effects, which are completely independent from elements that affect the TX chain, a multiplier M2 336 and an adder S2 338 may be provided in the ET chain.

The clock concept of the transceiver provides for a modulated clock to both the RFDAC (not shown) and the PADAC 352 (which is a digitally controlled oscillator (DCO) modulated by the phase modulator (PM) according to the polar architecture of the TX). All of the digital blocks may be provided with an un-modulated clock. Consequently, a fractional sample rate converter (FSRC-ET) 340 may be provided that correctly realizes the signal's conversion in between the digital and the analogue world. The PADAC 352 converts the digital information to an analog voltage signal which is then transduced to a modulated supply by the following DC-DC converter 150.

The ET operation parameters (compression point, tracker's settings, and PA biasing) may be modified in order to pass a linearity test in multi-cluster or carrier-aggregation cases, but the result is an optimization between linearity and current consumption. The switching mechanisms described herein helps to ensure linearity in difficult multi-cluster and TX carrier aggregation cases without affecting the performance in ET operation at maximum output power, which is a key performance indicator (KPI).

Figure 4:
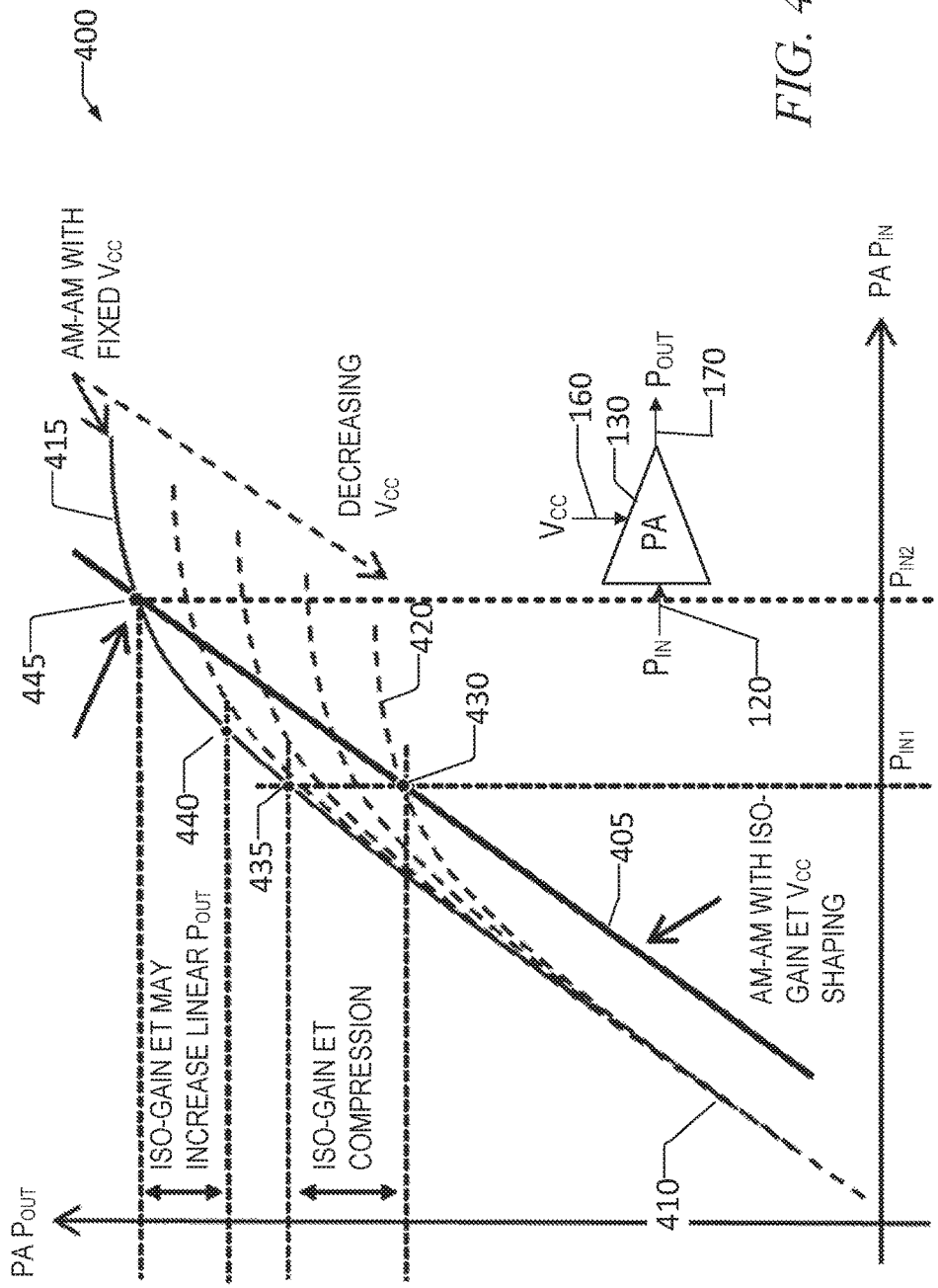
FIG. 4 is a graph that illustrates a linearity improvement given by ET, showing how the amplitude-to-amplitude modulation (AM/AM) characteristic of the PA can be engineered by selecting a correct correspondence between the envelope of the RF signal and the PA supply voltage.

FIG. 4 is a graph 400 that illustrates a linearity improvement given by ET, showing how the amplitude-to-amplitude modulation (AM/AM) characteristic of the PA can be engineered by selecting a correct correspondence between the envelope of the RF signal and the PA supply voltage. A straight AM/AM characteristic 405 of the PA operated in ET mode means that there is a constant gain provided by the PA at all instantaneous amplitudes of the signal's envelope, which defines the "ISO-gain" curve (the ISO-gain being the gain of the PA which does not change in response to variations in $V_{CC}$ and $V_{IN}$). The family of curved lines represent the AM/AM characteristics 410 when the PA is operated with a fixed $V_{CC}$, (that is, in APT mode) with the top characteristic 415 being a high $V_{CC}$, and the bottom characteristic 420 being a low $V_{CC}$.

As can be seen in FIG. 4, at a given PA input signal $P_{IN}$ 120, the output signal POUT 170 is the same 430 for operation in the ET mode and some minimum fixed $V_{CC}$. However, with the $V_{CC}$ set at a higher fixed voltage, for the same input signal $P_{IN}$, the output signal $P_{OUT}$ is higher 435. In any case, by operating in the ET mode, a linear output for the input at $P_{IN1}$ to $P_{IN2}$ (between points 430 and 445) may be achieved, whereas operation in the APT mode at any illustrated fixed voltage level given the same input at $P_{IN1}$ to $P_{IN2}$ results in non-linearity. In other words, when operating at the higher end of input signal PIN, the non-linear characteristics (e.g., between points 440 and 445) of the fixed voltage mode become more pronounced over the linear operation of the ET mode of operation (e.g., between points 430 and 445). As can be seen from FIG. 4, when operating in the lower input power regions, the linearity for operating in the APT mode at a fixed voltage may be acceptable.

According to an exemplary device described herein, the transmitter or the transceiver may be switched to operate in either the ET mode or the APT mode according to particular criteria that may result in beneficial operation of the device. In certain situations, the transceiver may be switched to use the ET mode or the APT mode based upon the target power levels of a particular transmission. However, some signals are challenging to handle in ET mode because of the nature of their ET regions, and may be difficult to deal with. Such a situation is present with LTE CA signals when the LTE modulation has multi-cluster transmissions constituted by disjointed resource blocks. As illustrated above, this creates very fast up and down transitions in the time domain, making ET difficult to do effectively. Therefore, when this situation is detected, switching to the ET mode or remaining in the ET mode is avoided, or, put differently, switching to the APT mode or remaining in the APT mode is undertaken. Thus, the system 100 is switchable between operating in the APT mode and an ET mode based on a threshold that is a function of the distribution of the allocated RBs (considering both multi-cluster and TX CA cases). The switching may cause the system 100 to revert to or stay in the APT mode whenever it is operating in the multi-cluster mode, or when the spacing between the clusters is higher than a specified threshold. The loss in efficiency due to reverting to the APT mode may be balanced by a better linearity in operating the PA 130.

Put another way, although the switching from the APT mode to the ET mode or maintaining the ET mode may be performed if the target power (TP) value is greater than some predefined envelope tracking threshold (ETT) value (and switching back to the APT mode or maintaining the APT mode, if the converse is true), further criteria for determining whether to switch/maintain the ET mode may be utilized.

Figure 5:
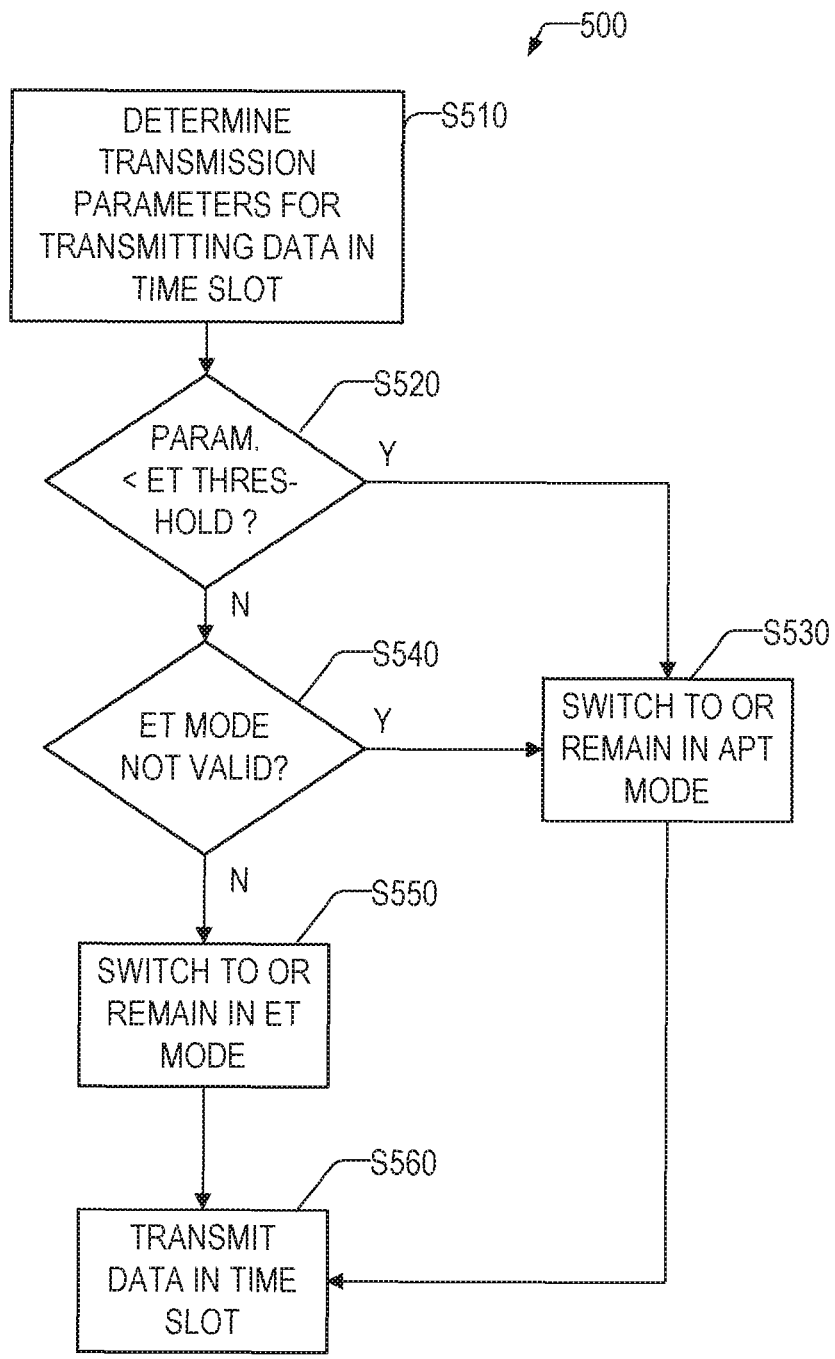
FIG. 5 is a flowchart that illustrates a high level process that may be used.

FIG. 5 is a flowchart that illustrates a high level process 500 that may be used.

In operation S510, the transmission parameters, including an average transmission power for the time slot, are determined. In operation S520, a determination is made to see if a first condition is met. As shown in FIG. 5, this first condition is whether the average transmission power is less than the ETT. This threshold may relate to an amount of power consumed by the ET circuitry to implement the ET mode. As discussed above, if the power consumed by the circuitry is greater than the power savings by running in ET mode and/or is less than the ETT (S520:Y), then the device, in operation S530, either switches to or remains in the APT mode for transmitting the data in the time slot in operation S560.

Otherwise (S520:N), a further determination is made to see if a second condition is met. In operation S540, this condition is generically described as being whether the ET mode is not valid or appropriate under the circumstances by applying further criteria. These further criteria can include the following factors: a) a number of allocated RBs for the transmission; b) a distance between the RBs, and c) a power ratio between disjoined clusters. These factors can be considered individually or can be combined in any way. Furthermore, the factors that are applied can be taken as being threshold-based, or could utilize a weighted factor analysis.

In a threshold case, and considering the factors individually, for factor (a), an RB count (RBC) threshold (RBCT) may be utilized, wherein if a number of RBs used in the transmission is below the RB count threshold, then the ET mode can be used as long as the other power requirements are met; otherwise, the APT mode is used. For factor (b), an RB distance (RBD) threshold (RBDT) may be utilized, such that if a maximum frequency distance is below the RB distance, then the ET mode can be used as long as the other power requirements are met; otherwise, the APT mode is used. For factor (c), a power ratio between disjoined clusters (CPR) threshold (CPRT) may be utilized, such that if a power difference between clusters is not exceeded, then the ET mode can be used as long as the other power requirements are met; otherwise, the APT mode is used. The factor tests may be combined in a number of ways to see if the second condition is met. Any or all of the following tests may be utilized as the second condition (further criteria) to determine whether to stay in or switch to the APT mode:

if (RBC>RBCT)  1)

if (RBD>RBDT)  2)

if (CPR>CPRT)  3)

In one implementation, these tests are connected by OR logic, meaning that if any one of them is true, the transmitter switches to or remains in the APT mode, but if they are all false, then the transmitter switches to or remains in the ET mode.

In a weighted factor case, appropriate weighting values ($w_1$-$w_3$) could be applied to factor values (a)-(c). Thus some overall ET mode threshold (EMT) value could be defined and the following test as the further test could be used to determine whether to stay in or switch to the ET mode:

if (EMT≤$w_1$RBC+$w_2$RBD+$w_3$CPR)

The weightings could be chosen to compensate for the particular units of the factors and empirical determinations of values that yield the most desirable results.

In a hybrid configuration, both threshold values and weightings could be used. In one configuration, the threshold values may take precedence over the weighting values, meaning that a threshold condition must be met before weighted factors can be considered. In another configuration, the weighting values may take precedence over the threshold values, meaning that a weighted factor can trump a factor not meeting a threshold if its value is large enough.

If the further criteria in operation S540 indicate that the ET mode is not valid (S540:Y), then the device switches to or remains in the APT mode S530. Otherwise (S540:N) the device switches to or remains in the ET mode S550 and proceeds to transmit the data in the time slot S560.

To describe some configurations in greater detail, reference is made to examples of hardware structures and interconnections usable in the designs of the present disclosure.

Figure 6:
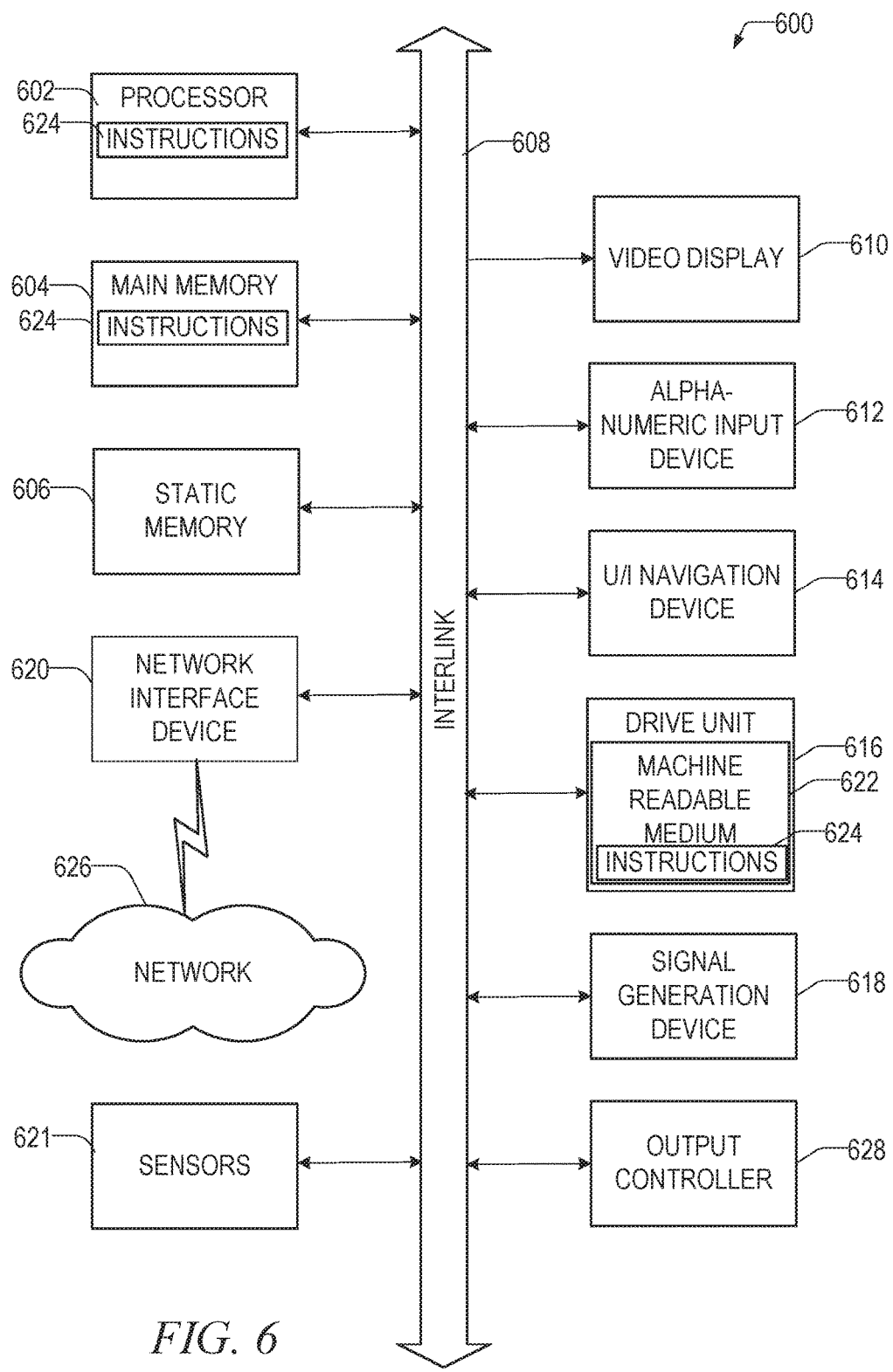
FIG. 6 is a block diagram illustrating a machine that may be a computer on which various processes described herein may be performed, in accordance with some aspects of the inventive subject matter.

FIG. 6 is a block diagram illustrating a machine that may be a computer on which various processes described herein may be performed. The machine (e.g., computer system, communications device) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example described herein, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB)), parallel, or other wired or wireless (e.g., infrared (IR), near field communication (NFC), etc.) controller connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute machine readable media.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine readable media. In some examples, machine readable media may include machine readable media that is not a transitory propagating signal.

The instructions 624 may further be transmitted or received over the communications network 626 using a transmission medium via the network interface device 620. The term "transmission medium" is defined herein to include any medium that is capable of storing, encoding, or carrying instructions for execution by the machine, and includes digital or analog communications signals or other medium to facilitate communication of such software.

The machine 600 may communicate with one or more other machines 600 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, WiGig®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, virtual private networks (VPN), or any other way of transferring data between machines 600. In an example, the network interface device 620 may include one or more physical jacks (e.g., Ethernet, coaxial, or phone jacks) or one or more antennas to connect to the communications network 626.

In an example, the network interface device 620 may include a plurality of antennas to wirelessly communicate using at least one of single-input multiple-output (SIMO), multiple-input multiple-output (MIMO), or multiple-input single-output (MISO) techniques. In some examples, the network interface device 620 may wirelessly communicate using Multiple User MIMO techniques.

A wide variety of computing devices may constitute a machine 600, as described herein. The following list includes a variety of devices that may fit the definition of a machine 600: a personal data assistant (PDA), a cellular telephone, including a smartphone, a tablet computing device, a laptop computer, a desktop computer, a workstation, a server computer, a mainframe computer, and the like.

By applying the techniques described herein, it is possible to improve a key performance indicator (KPI) of a mobile unit (namely, the amount of current/power the transmitter consumes at a particular antenna power level) that is capable of improving efficiency by being switchable between operation in the APT mode or the ET mode, but remains in the APT mode under operational situations that otherwise might suggest switching to an ET mode of operation.

For the purposes of promoting an understanding of the principles of this disclosure, reference has been made to the various configurations illustrated in the drawings, and specific language has been used to describe these configurations. However, no limitation of the scope of the inventive subject matter is intended by this specific language, and the inventive subject matter should be construed to encompass all embodiments and configurations that would normally occur to one of ordinary skill in the art. The configurations herein may be described in terms of functional block components and various processing steps. Such functional blocks may be realized by any number of components that perform the specified functions. The particular implementations shown and described herein are illustrative examples and are not intended to otherwise limit the scope of the inventive subject matter in any way. The connecting lines, or connectors shown in the various figures presented may, in some instances, be intended to represent example functional relationships and/or physical or logical couplings between the various elements. However, many alternative or additional functional relationships, physical connections or logical connections may be present in a practical device. Moreover, no item or component is essential unless the element is specifically described as "essential" or "critical". Numerous modifications and adaptations will be readily apparent to those skilled in this art.

EXAMPLES

Example 1 is an apparatus of a transmitter, the apparatus comprising: memory or a memory circuitry; and processing circuitry, configured to: calculate a supply voltage value to provide as a supply voltage for a power amplifier (PA) of the transmitter for transmissions during a transmission time slot (TS); when the supply voltage is less than an envelope tracking threshold (ETT), then configure the PA to transmit a signal in an average power tracking (APT) mode that maintains the supply voltage at the supply voltage value during the TS; when the supply voltage is greater than or equal to the ETT, and an APT condition is met, then configure the PA to transmit the signal in the APT mode; and when the supply voltage is greater than or equal to the ETT, and the APT condition is not met, then transmit by an adjustment to the supply voltage value to track an amplitude modulation envelope during the TS in an envelope tracking (ET) mode.

In Example 2, the subject matter of Example 1 optionally includes wherein the APT condition relates to a factor comprising one of: a resource block count (RBC), a resource block distance (RBD), or a power ratio between disjoined clusters (CPR).

In Example 3, the subject matter of Example 2 optionally includes wherein: factors of the APT condition comprise a threshold value comprising one of: a resource block count threshold (RBCT), a resource block distance threshold (RBDT), and a power ratio between disjoined clusters threshold (CPRT); and the APT condition is defined as: when the resource block count is greater than the resource block count threshold, or when the resource block distance is greater than the resource block distance threshold, or when the power ratio between disjoined clusters is greater than the power ratio between disjoined clusters threshold.

In Example 4, the subject matter of any one or more of Examples 2-3 optionally include wherein: the processing circuitry is further configured to: apply a weighting value to at least one of the factors; and the APT condition is defined as: when an ET threshold value is less than or equal to a sum of a first weighting factor times the resource block count, a second weighting factor times the resource block distance, and a third weighting factor times the power ratio between disjoined clusters.

In Example 5, the subject matter of any one or more of Examples 1-4 optionally include the power amplifier; and a DC-DC converter connected to a voltage supply of the power amplifier.

In Example 6, the subject matter of any one or more of Examples 1-5 optionally include wherein the transmitter device operates according to a Long-Term Evolution (LTE)-Advanced protocol.

Example 7 is a method for transmitting data from a transmitter or a transmitter device, comprising: calculating a supply voltage value to provide as a supply voltage for a power amplifier (PA) of the transmitter for a transmission time slot (TS); when the supply voltage is less than an envelope tracking threshold (ETT), then transmitting a signal using the PA while maintaining the supply voltage at the supply voltage value during the TS in an average power tracking (APT) mode; when the supply voltage is greater than or equal to the ETT, and an APT condition is met, then transmitting the signal in the APT mode; and when the supply voltage is greater than or equal to the ETT and the APT condition is not met, then performing the transmitting by adjusting the supply voltage value to track an amplitude modulation envelope during the TS in an envelope tracking (ET) mode.

In Example 8, the subject matter of Example 7 optionally includes wherein the APT condition relates to a factor comprising one of: a resource block count (RBC), a resource block distance (RBD), or a power ratio between disjoined clusters (CPR).

In Example 9, the subject matter of Example 8 optionally includes wherein the APT condition factors comprise a threshold value comprising one of: a resource block count threshold (RBCT), a resource block distance threshold (RBDT), and a power ratio between disjoined clusters threshold (CPRT).

In Example 10, the subject matter of Example 9 optionally includes wherein the APT condition is defined as: when the resource block count is greater than the resource block count threshold, or when the resource block distance is greater than the resource block distance threshold, or when the power ratio between disjoined clusters is greater than the power ratio between disjoined clusters threshold.

In Example 11, the subject matter of any one or more of Examples 8-10 optionally include applying a weighting value to at least one of the factors.

In Example 12, the subject matter of Example 11 optionally includes wherein the APT condition is defined as: when an ET threshold value is less than or equal to a sum of a first weighting factor times the resource block count, a second weighting factor times the resource block distance, and a third weighting factor times the power ratio between disjoined clusters.

In Example 13, the subject matter of any one or more of Examples 8-12 optionally include wherein the APT condition factors comprise: a threshold value comprising one of: a resource block count threshold (RBCT), a resource block distance threshold (RBDT), or a power ratio between disjoined clusters threshold (CPRT); and a weighting value for applying to at least one of the factors.

In Example 14, the subject matter of Example 13 optionally includes using a factor with the threshold value to take precedence over a factor with the weighting value.

1 In Example 15, the subject matter of any one or more of Examples 13-14 optionally include using a factor with the weighting value to take precedence over a factor with the threshold value.

In Example 16, the subject matter of any one or more of Examples 7-15 optionally include switching from the APT mode to the ET mode for the transmitting when performing the transmitting in the ET mode; and switching from the ET mode to the APT mode for the transmitting when performing the transmitting in the APT mode.

In Example 17, the subject matter of any one or more of Examples 7-16 optionally include wherein the transmitter device operates according to a Long-Term Evolution (LTE)-Advanced protocol.

In Example 18, the subject matter of any one or more of Examples 7-17 optionally include providing the supply voltage with a DC-DC converter.

Example 19 is a computer program product comprising one or more computer readable storage media comprising computer-executable instructions operable to, when executed by processing circuitry of a device, configure the station to perform any of the methods of Examples 7-18.

Example 20 is a computer program product comprising one or more tangible computer readable non-transitory storage media comprising computer-executable instructions operable to, when executed by processing circuitry of a device, configure the device to: calculate a supply voltage value to provide as a supply voltage for a power amplifier (PA) of the transmitter for a transmission time slot (TS); when the supply voltage is less than an envelope tracking threshold (ETT), then configure the PA to transmit a signal in an average power tracking (APT) mode that maintains the supply voltage at the supply voltage value during the TS; when the supply voltage is greater than or equal to the ETT, and an APT condition is met, then configure the PA to transmit the signal in the APT mode; and when the supply voltage is greater than or equal to the ETT, and the APT condition is not met, then transmit by an adjustment to the supply voltage value to track an amplitude modulation envelope during the TS in an envelope tracking (ET) mode.

In Example 21, the subject matter of Example 20 optionally includes wherein the APT condition relates to a factor comprising one of: a resource block count (RBC), a resource block distance (RBD), or a power ratio between disjoined clusters (CPR).

Example 22 is a system comprising means to perform any of the methods of Examples 7-18.

Example 23 is an apparatus for transmitting data from a transmitter device, comprising: means for calculating a supply voltage value to provide as a supply voltage for a power amplifier (PA) of the transmitter for a transmission time slot (TS); means for, when the supply voltage is less than an envelope tracking threshold (ETT), transmitting a signal using the PA while maintaining the supply voltage at the supply voltage value during the TS in an average power tracking (APT) mode; means for, when the supply voltage is greater than or equal to the ETT, and an APT condition is met, transmitting the signal in the APT mode; and means for, when the supply voltage is greater than or equal to the ETT and the APT condition is not met, performing the transmitting by adjusting the supply voltage value to track an amplitude modulation envelope during the TS in an envelope tracking (ET) mode.

In Example 24, the subject matter of Example 23 optionally includes wherein the APT condition relates to a factor comprising one of: a resource block count (RBC), a resource block distance (RBD), or a power ratio between disjoined clusters (CPR).

In Example 25, the subject matter of Example 24 optionally includes wherein the APT condition factors comprise a threshold value comprising one of: a resource block count threshold (RBCT), a resource block distance threshold (RBDT), and a power ratio between disjoined clusters threshold (CPRT).

In Example 26, the subject matter of Example 25 optionally includes wherein the APT condition is defined as: when the resource block count is greater than the resource block count threshold, when the resource block distance is greater than the resource block distance threshold, or when the power ratio between disjoined clusters is greater than the power ratio between disjoined clusters threshold.

In Example 27, the subject matter of any one or more of Examples 24-26 optionally include means for applying a weighting value to at least one of the factors.

In Example 28, the subject matter of Example 27 optionally includes wherein the APT condition is defined as: when an ET threshold value is less than or equal to a sum of a first weighting factor times the resource block count, a second weighting factor times the resource block distance, and a third weighting factor times the power ratio between disjoined clusters.

In Example 29, the subject matter of any one or more of Examples 24-28 optionally include wherein the APT condition factors comprise: a threshold value comprising one of: a resource block count threshold (RBCT), a resource block distance threshold (RBDT), or a power ratio between disjoined clusters threshold (CPRT); and a weighting value for applying to at least one of the factors.

In Example 30, the subject matter of Example 29 optionally includes means for using a factor with the threshold value to take precedence over a factor with the weighting value.

In Example 31, the subject matter of any one or more of Examples 29-30 optionally include means for using a factor with the weighting value to take precedence over a factor with the threshold value.

In Example 32, the subject matter of any one or more of Examples 23-31 optionally include means for switching from the APT mode to the ET mode for the transmitting when performing the transmitting in the ET mode; and means for switching from the ET mode to the APT mode for the transmitting when performing the transmitting in the APT mode.

In Example 33, the subject matter of any one or more of Examples 23-32 optionally include wherein the transmitter device operates according to a Long-Term Evolution (LTE)-Advanced protocol.

In Example 34, the subject matter of any one or more of Examples 23-33 optionally include providing the supply voltage with a DC-DC converter.

What is claimed is:

1. An apparatus of a transmitter, the apparatus comprising:
   memory; and processing circuitry, configured to:
   calculate a supply voltage value to provide as a supply voltage for a power amplifier (PA) of the transmitter for transmissions during a transmission time slot (TS);
   when the supply voltage is less than an envelope tracking threshold (ETT), then configure the PA to transmit a signal in an average power tracking (APT) mode that maintains the supply voltage at the supply voltage value during the TS;
   when the supply voltage is greater than or equal to the ETT, and an APT condition is met, then configure the PA to transmit the signal in the APT mode; and
   when the supply voltage is greater than or equal to the ETT, and the APT condition is not met, then transmit by an adjustment to the supply voltage value to track an amplitude modulation envelope during the TS in an envelope tracking (ET) mode.

2. The apparatus of claim 1, wherein the APT condition relates to a factor comprising one of: a resource block count (RBC), a resource block distance (RBD), or a power ratio between disjoined clusters (CPR).

3. The apparatus of claim 2, wherein:
   factors of the APT condition comprise a threshold value comprising one of: a resource block count threshold (RBCT), a resource block distance threshold (RBDT), and a power ratio between disjoined clusters threshold (CPRT), and
   the APT condition is defined as:
      when the resource block count is greater than the resource block count threshold, or when the resource block distance is greater than the resource block distance threshold, or when the power ratio between disjoined clusters is greater than the power ratio between disjoined clusters threshold.

4. The apparatus of claim 2, wherein:
   the processing circuitry is further configured to:
      apply a weighting value to at least one of the factors; and
   the APT condition is defined as:
      when an ET threshold value is less than or equal to a sum of a first weighting factor times the resource block count, a second weighting factor times the resource block distance, and a third weighting factor times the power ratio between disjoined clusters.

5. The apparatus of claim 1, further comprising:
   the power amplifier; and
   a DC-DC converter connected to a voltage supply of the power amplifier.

6. The apparatus of claim 1, wherein the transmitter device operates according to a Long-Term Evolution (LTE)-Advanced protocol.

7. A method for transmitting data from a transmitter device, comprising:
- calculating a supply voltage value to provide as a supply voltage for a power amplifier (PA) of the transmitter for a transmission time slot (TS);
- when the supply voltage is less than an envelope tracking threshold (ETT), then transmitting a signal using the PA while maintaining the supply voltage at the supply voltage value during the TS in an average power tracking (APT) mode;
- when the supply voltage is greater than or equal to the ETT, and an APT condition is met, then transmitting the signal in the APT mode; and
- when the supply voltage is greater than or equal to the ETT and the APT condition is not met, then performing the transmitting by adjusting the supply voltage value to track an amplitude modulation envelope during the TS in an envelope tracking (ET) mode.

8. The method of claim 7, wherein the APT condition relates to a factor comprising one of: a resource block count (RBC), a resource block distance (RBD), or a power ratio between disjoined clusters (CPR).

9. The method of claim 8, wherein the APT condition factors comprise a threshold value comprising one of: a resource block count threshold (RBCT), a resource block distance threshold (RBDT), and a power ratio between disjoined clusters threshold (CPRT).

10. The method of claim 9, wherein the APT condition is defined as:
- when the resource block count is greater than the resource block count threshold, or when the resource block distance is greater than the resource block distance threshold, or when the power ratio between disjoined clusters is greater than the power ratio between disjoined clusters threshold.

11. The method of claim 8, further comprising:
- applying a weighting value to at least one of the factors.

12. The method of claim 11, wherein the APT condition is defined as:
- when an ET threshold value is less than or equal to a sum of a first weighting factor times the resource block count, a second weighting factor times the resource block distance, and a third weighting factor times the power ratio between disjoined clusters.

13. The method of claim 8, wherein the APT condition factors comprise:
- a threshold value comprising one of: a resource block count threshold (RBCT), a resource block distance threshold (RBDT), or a power ratio between disjoined clusters threshold (CPRT); and
- a weighting value for applying to at least one of the factors.

14. The method of claim 13, further comprising using a factor with the threshold value to take precedence over a factor with the weighting value.

15. The method of claim 13, further comprising using a factor with the weighting value to take precedence over a factor with the threshold value.

16. The method of claim 7, further comprising:
- switching from the APT mode to the ET mode for the transmitting when performing the transmitting in the ET mode; and
- switching from the ET mode to the APT mode for the transmitting when performing the transmitting in the APT mode.

17. The method of claim 7, wherein the transmitter device operates according to a Long-Term Evolution (LTE)-Advanced protocol.

18. The method of claim 7, further comprising providing the supply voltage with a DC-DC converter.

19. A computer program product comprising one or more tangible computer readable non-transitory storage media comprising computer-executable instructions operable to, when executed by processing circuitry of a device, configure the device to:
- calculate a supply voltage value to provide as a supply voltage for a power amplifier (PA) of the transmitter for a transmission time slot (TS);
- when the supply voltage is less than an envelope tracking threshold (ETT), then configure the PA to transmit a signal in an average power tracking (APT) mode that maintains the supply voltage at the supply voltage value during the TS;
- when the supply voltage is greater than or equal to the ETT, and an APT condition is met, then configure the PA to transmit the signal in the APT mode; and
- when the supply voltage is greater than or equal to the ETT, and the APT condition is not met, then transmit by an adjustment to the supply voltage value to track an amplitude modulation envelope during the TS in an envelope tracking (ET) mode.

20. The computer program product of claim 19, wherein the APT condition relates to a factor comprising one of: a resource block count (RBC), a resource block distance (RBD), or a power ratio between disjoined clusters (CPR).

* * * * *

UNITED STATES PATENT AND TRADEMARK OFFICE
CERTIFICATE OF CORRECTION

PATENT NO. : 10,129,823 B2
APPLICATION NO. : 15/475996
DATED : November 13, 2018
INVENTOR(S) : Camuffo et al.

Page 1 of 1

It is certified that error appears in the above-identified patent and that said Letters Patent is hereby corrected as shown below:

In the Claims

In Column 12, Line 43, in Claim 3, delete "(CPRT)," and insert --(CPRT);-- therefor Signed and Sealed this
Twenty-first Day of April, 2020

Andrei Iancu
*Director of the United States Patent and Trademark Office*